(12) United States Patent
Lin

(10) Patent No.: US 6,587,390 B1
(45) Date of Patent: Jul. 1, 2003

(54) MEMORY CONTROLLER FOR HANDLING DATA TRANSFERS WHICH EXCEED THE PAGE WIDTH OF DDR SDRAM DEVICES

(75) Inventor: Shuaibin Lin, Broomfield, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/039,083

(22) Filed: Dec. 31, 2001

(51) Int. Cl.[7] .................................................. G11C 8/00
(52) U.S. Cl. ............................ 365/230.02; 365/230.06; 365/238.5
(58) Field of Search ..................... 365/230.02, 230.06, 365/238.5, 235; 345/531

(56) References Cited

U.S. PATENT DOCUMENTS 6,380,945 B1 * 4/2002 MacInnis et al. ........... 711/147
6,412,048 B1 * 6/2002 Chauvel et al. ............. 711/158
6,446,173 B1 * 9/2002 Pham .......................... 711/147

* cited by examiner

*Primary Examiner*—Richard Elms
*Assistant Examiner*—Jung H. Hur
(74) *Attorney, Agent, or Firm*—Conley, Rose & Tayon

(57) ABSTRACT

A memory controller includes a pair of input command decoders and a pair of multiplexers. If the memory controller receives a data transfer request related to a read or write burst which will stay within a page of memory, the first input command decoder circuit generates a first input command which is then passed, in sequence, by the first and second multiplexers. Conversely, if the data transfer request relates to a read or write burst which will burst over a page of the memory, the second input command decoder circuit generates second and third input commands. The second input command passes through the second multiplexer circuit while the third input command is held in a command register. The third input command is subsequently passed through the first and second multiplexers.

16 Claims, 5 Drawing Sheets

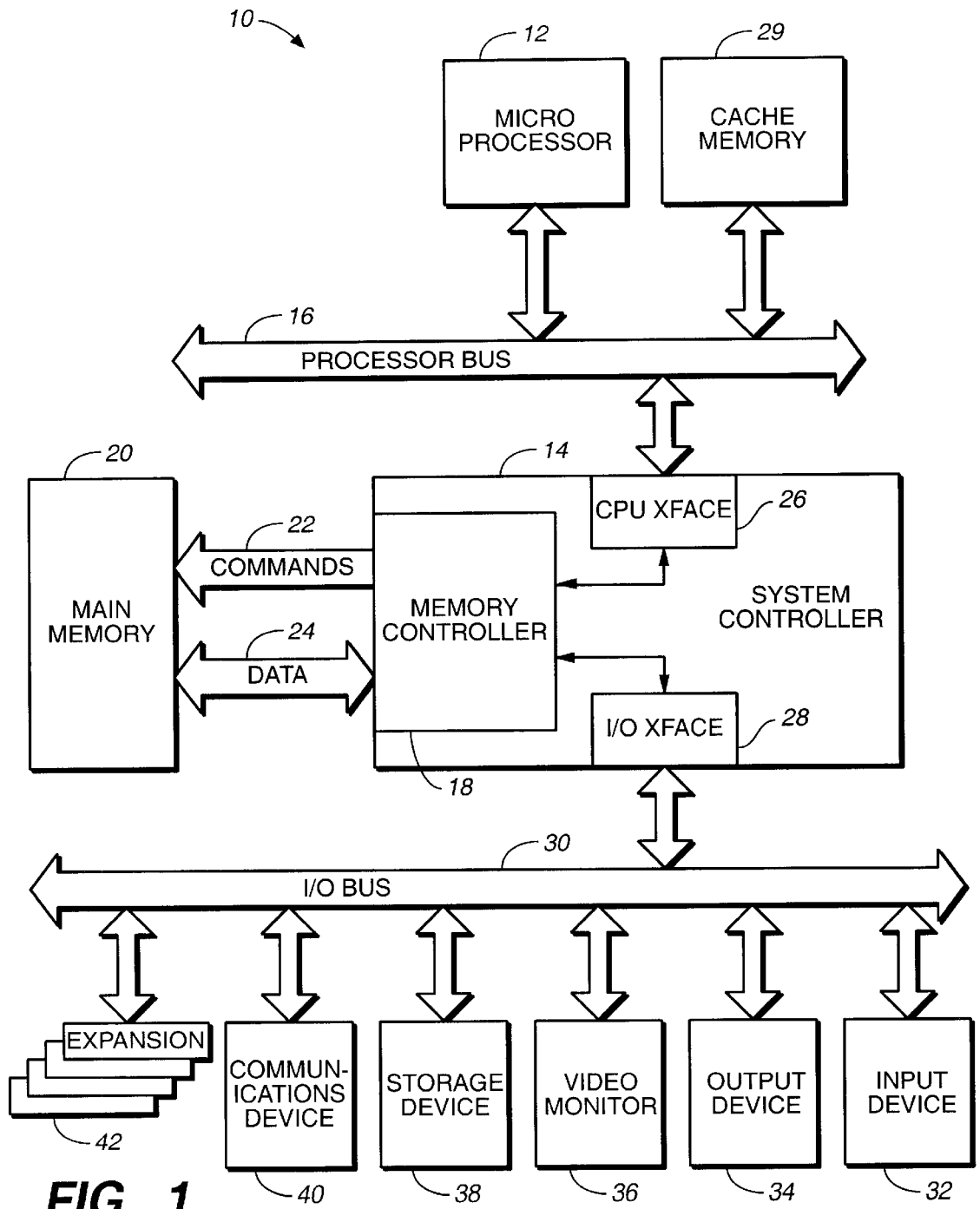
FIG._1

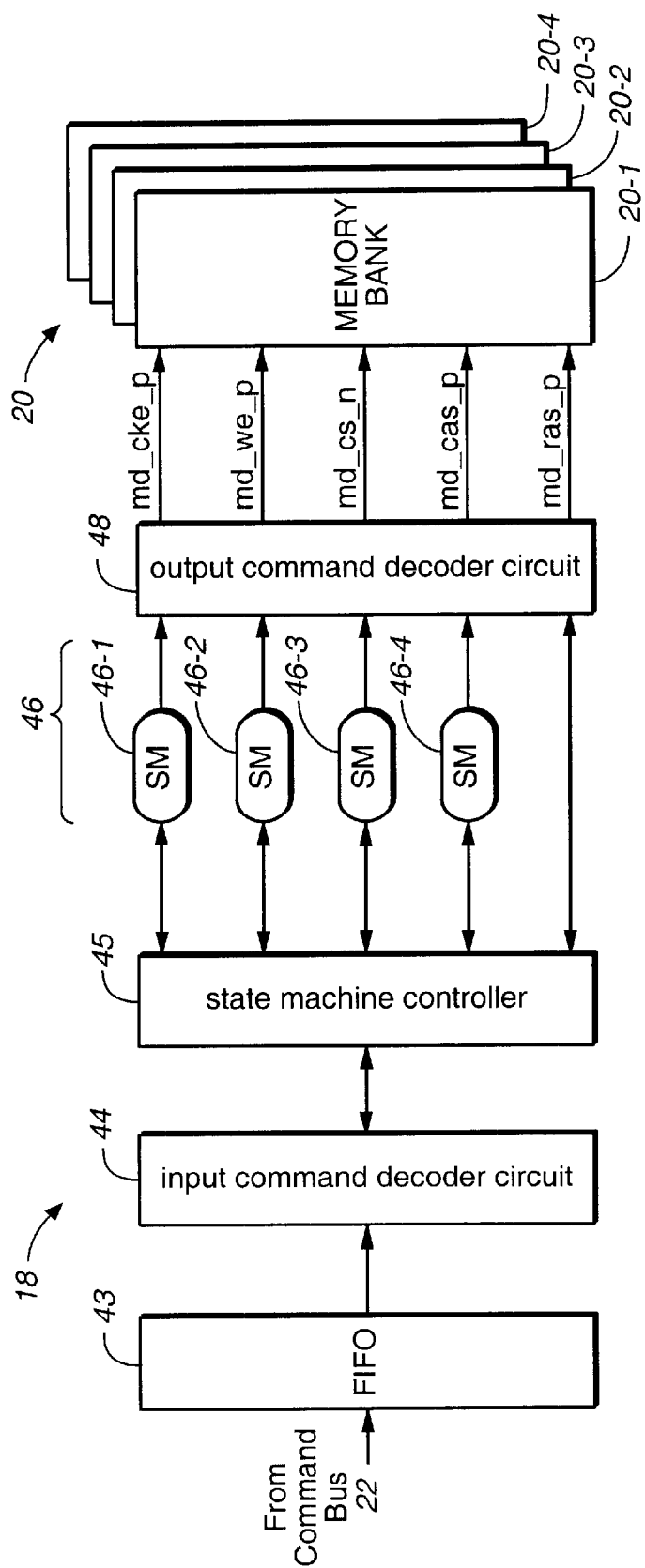
FIG._2A

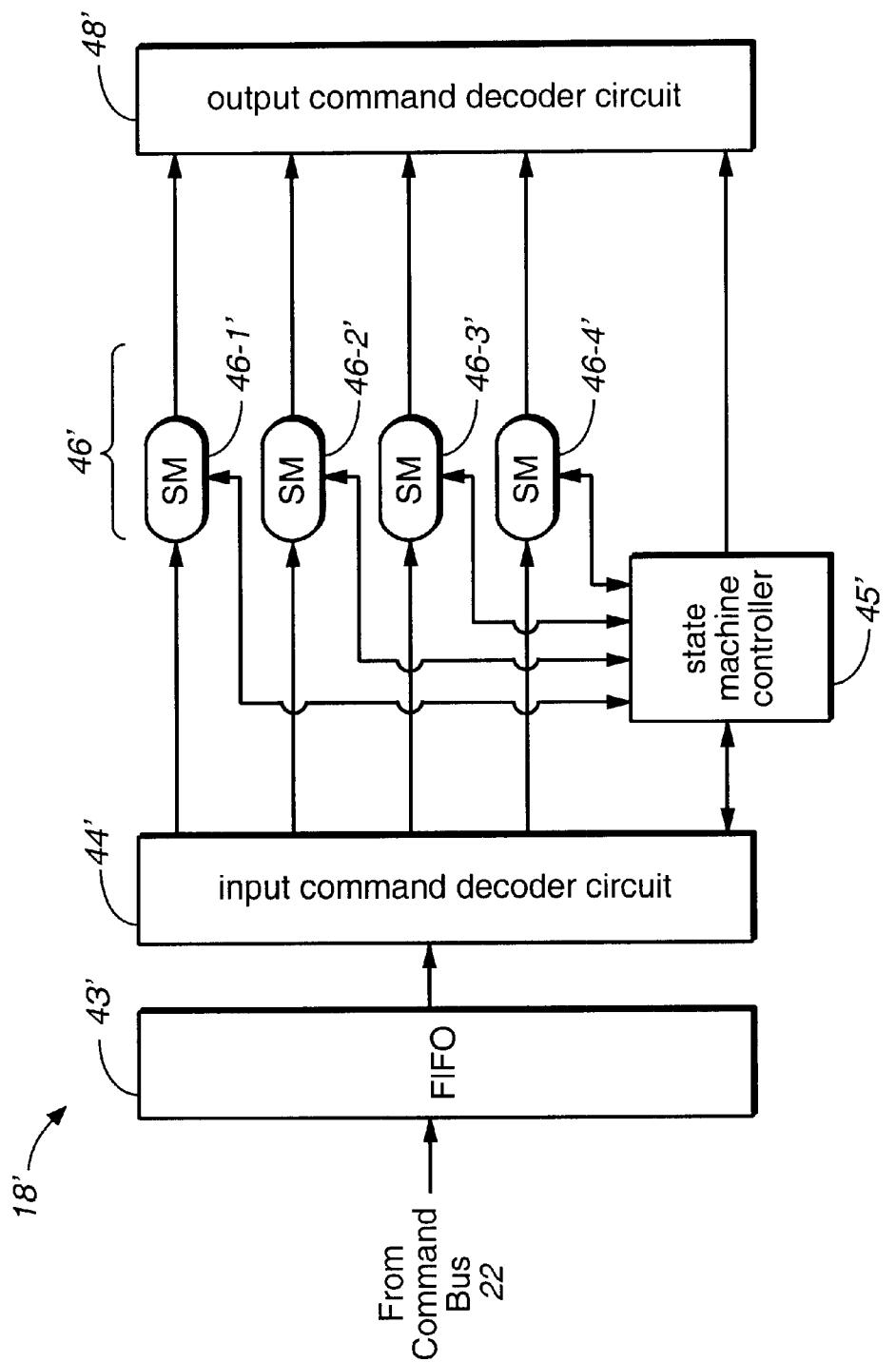
FIG._2B

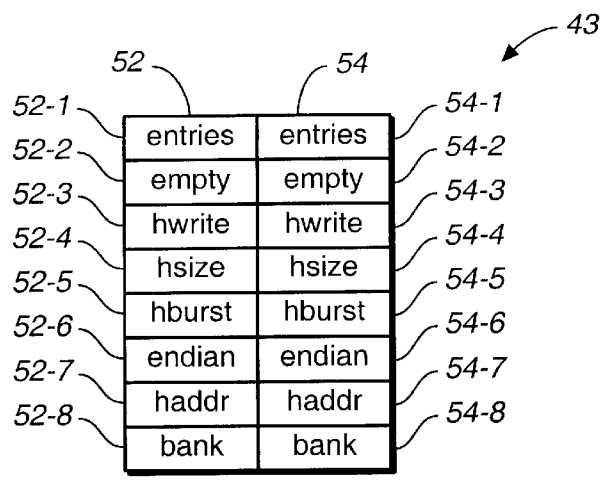
FIG._3
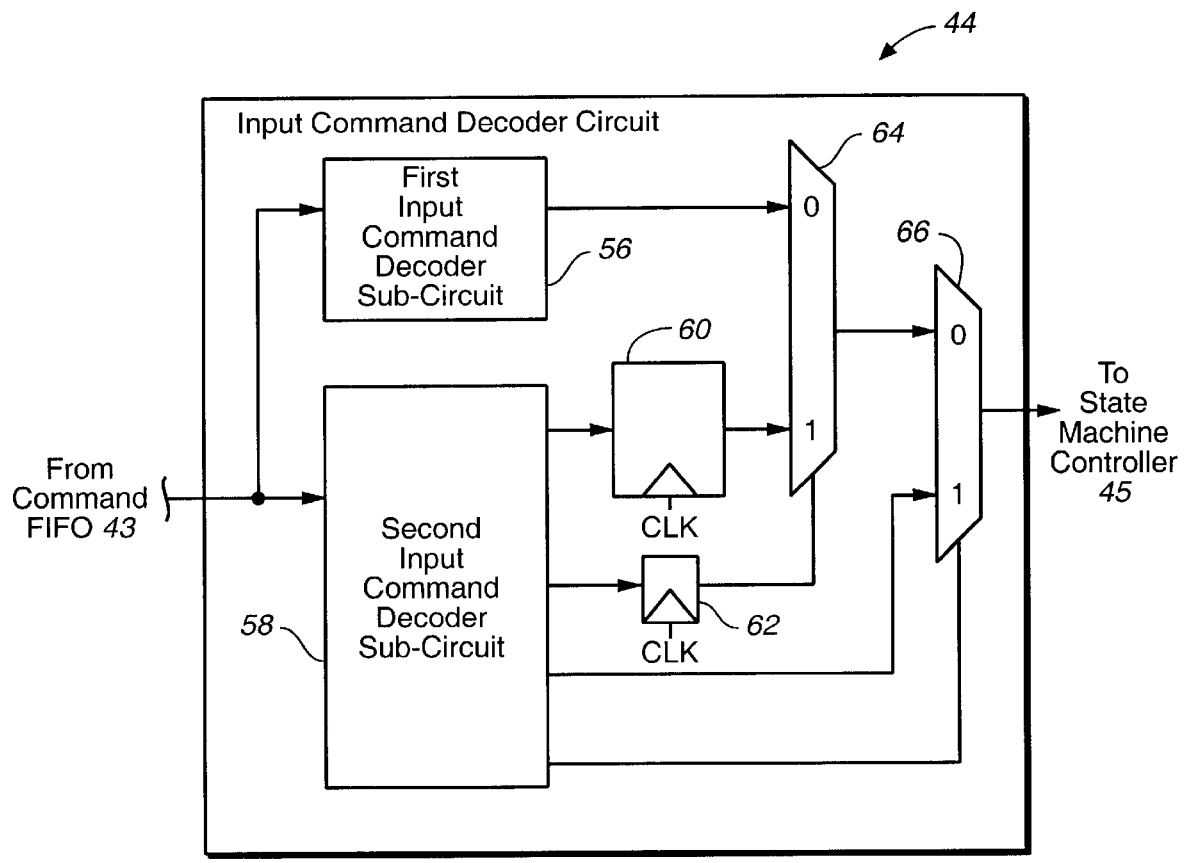
FIG._4

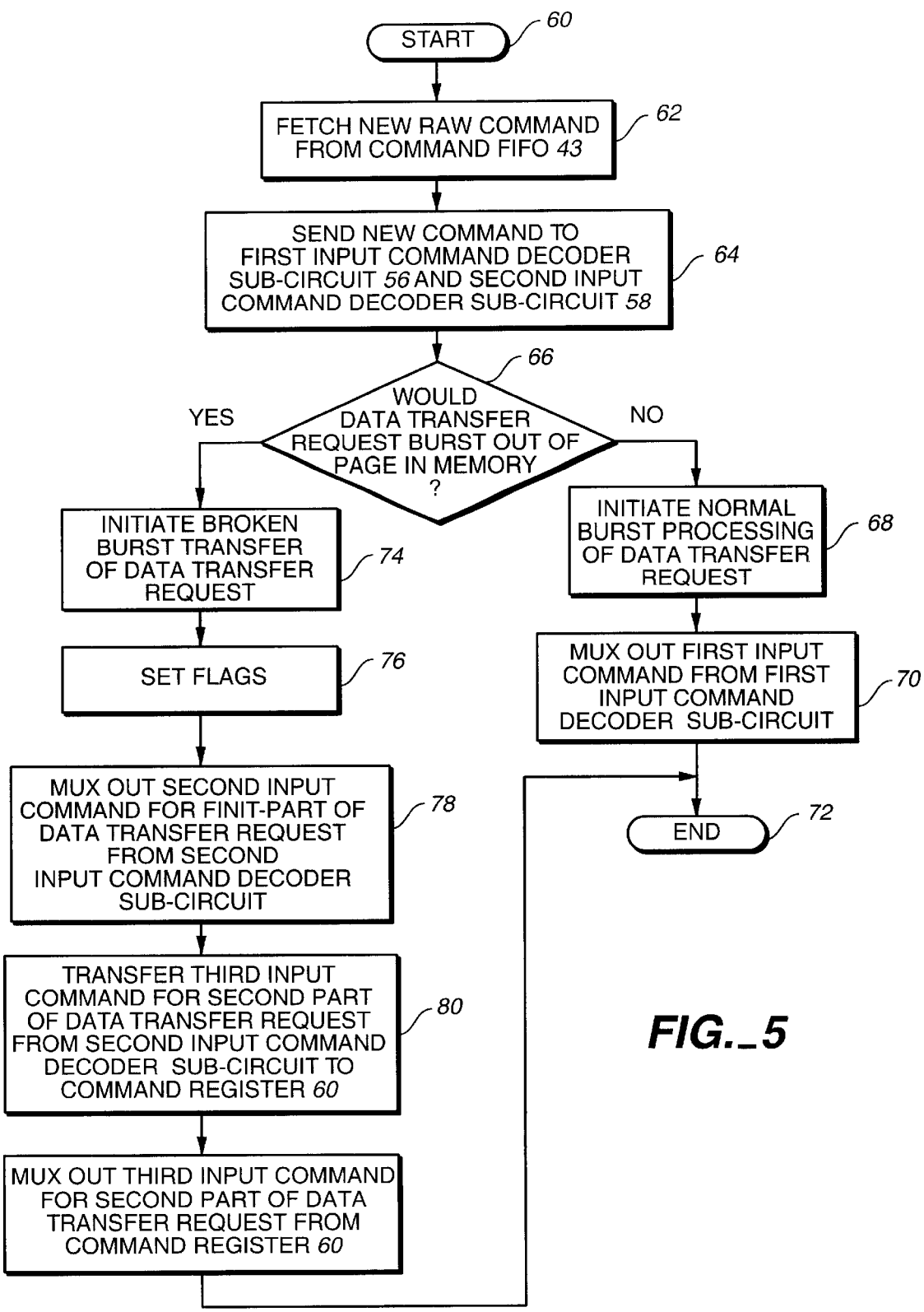
FIG._5

MEMORY CONTROLLER FOR HANDLING DATA TRANSFERS WHICH EXCEED THE PAGE WIDTH OF DDR SDRAM DEVICES

CROSS REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

FIELD OF THE INVENTION

The present invention relates to a memory controller for a double data rate synchronous dynamic random access memory (DDR SDRAM) device and, more particularly, to a memory controller configured to handle data transfers which exceed the page width for a DDR SDRAM device.

BACKGROUND OF THE INVENTION

In recent years, the use of DDR SDRAM devices in memory subsystems has become increasingly common. While DDR SDRAM devices are commercially available in a wide variety of configurations, one currently available DDR SDRAM device has a 64 Mbit×16 memory chip configuration which provides a total memory of 8 Mbyte for a single chip. As the page size for such a device is 512 bytes, it is limited to one continuous burst of up to 512 bytes.

The newly developed advanced high performance bus (AHB) is configured to handle data transfer requests of up to 1,024 bytes. As a result, AHB devices which comply with the AHB protocol are capable of handling data transfer requests of 1,024 bytes for both incrementing and wrapping bursts. Because of the enhanced capabilities of AHB devices, when designing a memory controller for a DDR SDRAM, it is oftentimes necessary to require that the memory controller be configured to handle data transfer requests of up to 1,024 bytes. As DDR SDRAMs having a 64 Mbit×16 configuration are limited to continuous bursts of no more than 512 bytes, they are not suitable for use in memory subsystems intended to handle requests from AHB devices. As a result, the choice of memory chips available to the designer of an AHB-compliant memory subsystem has become unnecessarily limited.

For these reasons, it would be desirable to have a memory subsystem configured to reduce the effect of the configuration of the memory chip itself as a limit on the capability of the associated memory subsystem to handle data transfer requests.

SUMMARY OF THE INVENTION

In various embodiments thereof, the present invention is respectively directed to a memory controller, a memory subsystem and a computer system in which the memory controller includes first and second decoder circuits and a multiplexer circuit. The first decoder circuit generates a first input command for a data transfer request if the request relates to a data transfer sized at or below a threshold value while the second decoder circuit generates second and third input commands for a data transfer request if the request relates to a data transfer sized above the threshold value. The multiplexer circuit is configured to selectively pass the first input command generated by the first decoder circuit if the data transfer is sized at or below the threshold value or the second and third input commands generated by the second decoder circuit if the data transfer is sized above the threshold value. The threshold value may be determined from a page size for the memory, a size of the data transfer request and a starting address, within the memory, for the data transfer request.

In various aspects of these embodiments of the invention, the multiplexer circuit is further configured to include a pair of 2:1 multiplexers, each having first and second inputs and an output. The first and second inputs to the first multiplexer are coupled to the first and second decoder circuits, respectively. The first and second inputs to the second multiplexer, on the other hand, are coupled to the output of the first multiplexer and the second decoder circuit. In these aspects of the invention, if the data transfer request relates to a data transfer sized at or below the threshold value, the first multiplexer passes the first input command generated by the first decoder circuit and the second multiplexer passes the first input command passed by the first multiplexer. Further, if the data transfer request relates to a data transfer sized above the threshold value, the first multiplexer passes, in sequence, the first input command generated by the first decoder circuit and the third input command generated by the second decoder circuit and the second multiplexer passes, in sequence, the second input command generated by the second decoder circuit and the third input command generated by the second decoder circuit.

BRIEF DESCRIPTION OF THE DRAWINGS

FIG. 1 is a block diagram of a computer system constructed in accordance with the teachings of the present invention.

FIG. 2A is an expanded block diagram of a memory controller and a memory of the computer system of FIG. 1.

FIG. 2B is an expanded block diagram illustrating an alternate configuration of the memory controller of FIG. 2A.

FIG. 3 is an expanded block diagram of a first-in-first-out (FIFO) register of the memory controller of FIG. 2A.

FIG. 4 is an expanded block diagram of a first decoder circuit of the memory controller of FIG. 2A.

FIG. 5 is a flow chart of a method by which the memory controller of FIG. 2A handles "broken burst" data transfer requests.

DETAILED DESCRIPTION OF THE INVENTION

Referring first to FIG. 1, a computer system 10, for example, a personal computer (PC) or file server, constructed in accordance with the teachings of the present invention may now be seen. The computer system 10 includes a central processing unit (CPU) 12 for example, a microprocessor, coupled to a system controller 14 by a processor bus 16 that carries address, data and control signals therebetween. In one embodiment of the invention, the processor bus 16 is an AHB bus and the microprocessor 12 and system controller 14 are both AHB devices configured in accordance with AHB protocols, including those which mandate the ability to handle data transfer requests of up to 1,024 bytes.

The system controller 14 includes a memory controller 18 for accessing a main memory 20 via a memory command bus 22 and a memory data transfer bus 24. The system controller 14 also includes CPU interface circuitry 26, a cache controller (not shown), and input/output (I/O) interface circuitry 28. The CPU interface circuitry 26 couples the microprocessor 12 with other components of the system controller 14 such as the memory controller 18. The cache controller controls data transfer operations to a cache memory 29 that provides higher speed access to a subset of the information stored in the main memory 20.

Multiple I/O devices are coupled to the system controller 14 by I/O interface circuitry 28 and I/O bus 30. Of course, the I/O bus 30 may itself be a combination of one or more bus systems and associated circuitry. As shown in FIG. 1, the multiple I/O devices coupled to the system controller 14 by the I/O interface circuitry 28 and the I/O bus 30 include a data input device 32, for example a keyboard or mouse, a data output device 34, for example, a printer, a video monitor 36 (which, while not shown in FIG. 1 for ease of description, is typically coupled with the system controller 14 by a high speed video bus), an auxiliary data storage device 38, for example, a hard disk, and a communications device 40, for example, a modem or local area network (LAN) interface. Finally, one or more expansion slots 42 are provided for accommodation of other I/O devices not shown in FIG. 1.

Referring next to FIG. 2A, the memory controller 18 and the main memory 20 of the computer system 10 will now be described in greater detail. Of course, while the memory controller 18 and the main memory 20 is suitable for use within a computer system such as the computer system 10 illustrated in FIG. 1, it should be clearly understood that such a use is but one of a wide variety of suitable uses for the memory controller 18 and the main memory 20. Accordingly, while the term "main" is used in conjunction with the memory 20 in view of the disclosed use thereof within the computer system 10, the term should not be seen as limiting the invention to any specific embodiment thereof. Furthermore, while computer systems such as the computer system 10 typically include one or more memory devices in addition to the main memory, it should be clearly understood that the memory controller 18 and the main memory controller 20 may collectively be viewed as a memory subsystem suitable for use within a computer system or another memory-demanding electronic device.

As may be seen in FIG. 2A, the main memory 20 has four memory banks 20-1 through 20-4. The memory banks 20-1 through 20-4 of the main memory 20 is constructed using a single or two-chip deep DDR SDRAM memory chip arrangement. Of course, DDR SDRAM memory chips having other configurations would be equally suitable for the uses contemplated herein if, like the disclosed chip configuration, their page size were also less than 1,024 bytes. It should be noted, however, that depending on the particular configuration of the selected DDR SDRAM memory chip, the widthwise and depthwise arrangement thereof may vary. It should be further noted that other types of memory devices, for example, SRAM or SDRAM devices, are equally suitable for the uses contemplated herein. Furthermore, the disclosure of the main memory 20 as being configured to have four memory banks is purely by way of example and it is fully contemplated that, subject to various considerations, the main memory 20 may be configured to have other numbers of memory banks.

Also shown in FIG. 2A is a first, or output command generation, portion of the memory controller 18. More specifically, FIG. 2A illustrates that portion of the memory controller 18 which receives raw read/write commands over the command bus 22, uses the received raw read/write commands to generate output commands to be used in connection with data reads and/or data writes to/from the main memory 20 and issues the generated output commands to the main memory 20. The output commands issued by the memory controller 18 to the main memory 20 include clock enable (CKE), write enable (WE), chip select (CS), column address select (CAS), row address select (RAS), bank select (BANK), row/column address (ADDR) and write data mask (DM) commands. The remaining portions of the memory controller 18, including those portions of the memory controller 18 dedicated to transmitting write data to the main memory 20 and receiving read data from the main memory 20 over the 32-bit data bus 24 have been omitted from FIG. 2A for ease of description.

The output command generation portion of the memory controller 18 is comprised of a command first-in-first-out (FIFO) register 43, an input command decoder circuit 44, a state machine array controller 45, a state machine array 46 and an output command decoder circuit 48. Of these, the state machine array 46 is comprised of four state machines 46-1 through 46-4 coupled in parallel between the state machine controller 45 and the output command decoder circuit 48, although, as previously noted, the present disclosure of the memory 20 as including four memory banks 20-1 through 20-4 is purely by way of example and should not be interpreted as a limitation on the teachings set forth herein.

The command FIFO 43 is a two entry deep FIFO that queues raw commands received over the command bus 22. When the state machine array 46 is ready for a new state machine input command, the state machine controller 45 issues a control signal to the input command decoder circuit 44 which causes the input command decoder circuit 44 to fetch the contents of a first entry in the command FIFO 43. Within the input command decoder circuit 44, raw commands fetched from the first entry of the command FIFO 43 are converted into input commands which include, among other components, a chip and bank address for the data transfer request. The input commands generated by the input command decoder 44 are transmitted to the state machine controller 45 for further decoding. More specifically, for each input command received thereby, the state machine controller 45 determines a corresponding state machine input command related to a state transition which a target memory bank, i.e., the memory bank corresponding to the chip and bank address contained in the input command, must undergo in order to execute the input command.

When received by a state machine, a state machine input command causes the state machine to change from a current state to a next state and to generate a state machine output command which will cause the target memory bank to perform the desired state transition. U.S. patent application Ser. No. 10/036,695, entitled "A Multi-Bank Memory Device Having A 1:1 State Machine-to-Memory Bank Ratio", and hereby incorporated by reference as if reproduced in its entirety, discloses input commands which may be issued to the state machines 46-1 through 46-4, a current state for the state machines 46-1 through 46-4 when receiving the state machine input commands, state machine output command generated by the state machines 46-1 through 46-4 in response to receipt of the state machine input commands and a next state for the state machines 46-1 through 46-4 receiving the state machine input commands.

As disclosed in U.S. patent application Ser. No. 10/036, 695, the state machine input commands generated by the state machine controller 45 will either be a shared state input command or a bank-specific input command. If the state machine input command generated by the state machine controller 45 from the input command received thereby, is a shared state machine command, the state machine controller 45 generates the corresponding state machine output command and transmits the generated state machine output command to the output command decoder circuit 48. Conversely, if the state machine input command generated by the state machine controller 45 using the input command received from the input command decoder circuit 44 is a bank-specific state machine input commands, the state machine controller 45 transmits both the input command received from the input command decoder circuit 44 and the state machine input command generated thereby to each state machine 46-1 through 46-4 of the state machine array 46.

In turn, each one of the state machines 46-1 through 46-4 examines the chip and bank address included in the input command generated by the input command decoder circuit 44 to determine if the state machine input command is intended for that particular state machine. If the chip and bank address included in the input command generated by the input command decoder circuit 44 identifies the memory bank corresponding to that state machine, the state machine will process the received state machine input command. Conversely, if the chip and bank address does not identify the memory bank corresponding to that state machine, the state machine will ignore the state machine input command. Thus, while all four of the state machines 46-1 through 46-4 receive a particular state machine input command, only one of those state machines will undergo a state transition and generate a state machine output command in accordance with U.S. patent application Ser. No. 10/036,695.

The state machine controller 45 regulates input command flow from the command FIFO 43 and state transitions, by the state machines 46-1 through 46-4, to-and-from bank-specific states. The state machine undergoing the state transition will return state information to the state machine controller 45. Using the state information received from the state machine undergoing the state transition, the state machine controller 45 generates the control signal which causes the input command decoder circuit 44 to fetch the contents issued to the input command decoder circuit 44 to initiate a fetch from the command FIFO 43. Of course, the state machine controller 45 would maintain the corresponding state information for the shared state transitions for which the state machine controller 45 generates state machine output commands on behalf of the state machines 46-1 through 46-4 and would generate the control signals based upon the state information maintained for these shared states. The state machine controller 45 will not, however, process a new burst request before the current burst is finished. The state machine controller 45 will also insert hidden precharges and activations during NOP cycles. Whether received directly from the state machine controller 45 or from one of the state machines 46-1 through 46-4 of the state machine array, the output command decoder circuit 48 constructs the CKE, WE, CS, CAS and RAS commands which enable the memory controller 18 to access the specified location within one of the memory banks 20-1 through 20-8.

Referring next to FIG. 2B, an alternate configuration of the memory controller 18, hereafter referenced as memory controller 18', will now be described in greater detail. As before, only a first, or output command generation, portion of the memory controller 18' is described and illustrated herein while the remaining portions of the memory controller 18' have been omitted from FIG. 2B for ease of description. Like the memory controller 18, the output command generation portion of the memory controller 18' is comprised of a command first-in-first-out (FIFO) register 43' an input command decoder circuit 44', a state machine array controller 45', a state machine array 46' comprised of four state machines 46-1' through 46-4', and an output command decoder circuit 48'. Similar to the configuration of the memory controller 18 illustrated in FIG. 2A, here, the state machine controller 45' is coupled to the input command decoder circuit 44' and the output command decoder circuit 48' is coupled to the state machine controller 45'. Unlike the prior configuration of the memory controller 18, however, in addition to being coupled to the state machine controller 45' and the output command decoder circuit 48', each state machine 46-1' through 46-4' is also coupled to the input command decoder circuit 44'. While the memory controller 18' includes a number of additional connections, specifically, the additional connections between the input command decoder circuit 44' and the state machines 46-1' through 46-4',the state machine controller 45' no longer needs to both pass the input commands generated by the input command decoder circuit 44' to each of the state machines 46-1' through 46-4' and also process the received input commands to generate state machine input commands.

The operation of the memory controller 18' differs slightly from that of the memory controller 18. More specifically, the operation of the memory controller 18' differs in that the commands generated by the input command decoder 44' are transmitted to each state machine 46-1' through 46-4' of the state machine array 46' as well as to the state machine controller 45'. Thus, if the state machine input command generated by the state machine controller 45' using the input command received from the input command decoder circuit 44' is a bank-specific state machine input command, the state machine controller 45' need only transmit the state machine input command generated thereby to each state machine 46-1' through 46-4' of the state machine array 46'. Each one of the state machines 46-1' through 46-4' will then examine the chip and bank address included in the input command received from the input command decoder circuit 44' to determine if the state machine input command received from the state machine controller 45' is intended for that particular state machine. If the chip and bank address included in the input command received from the input command decoder circuit 44' identifies the memory bank corresponding to that state machine, the state machine will process the state machine input command received from the state machine controller 45'. Conversely, if the chip and bank address does not identify the memory bank corresponding to that state machine, the state machine will ignore the state machine input command.

Thus, as before, while all four of the state machines 46-1' through 46-4' receive the state machine input commands generated by the state machine controller 44', only one of those state machines will undergo a state transition and generate a state machine output command. In addition the state machine undergoing the state transition will return state information to the state machine controller 45'. Thereafter, operation of the memory controller 18' is the same as that for the memory controller 18. Accordingly, further discussion of the memory controller 18' is not necessary.

Referring next to FIG. 3, the command FIFO 43 will now be described in greater detail. As may now be seen, the command FIFO 43 is comprised of first and second registers 52 and 54 configured for respectively holding first and second data transfer requests received by the memory controller 18. Each one of the first and second registers 52 and 54 is comprised of first, second, third, fourth, fifth, sixth, seventh and eighth fields 52-1 through 52-8 and 54-1 through 54-8, respectively. The first (or "entries") field 52-1, 54-1 of the registers 52, 54 holds information describing the number of transactions required to perform the requested data transfer operation if the operation is a WRITE operation. For example, if the data transfer request was for a 16 byte WRITE operation and the data transfer was to be conducted over a 2 byte wide data bus 24, the contents of the entries field 52-1, 54-1 would be eight, thereby reflecting that the data transfer request would require eight transactions. The second (or "empty") field 52-2, 54-2 of the registers 52, 54 holds information indicating whether the data contained in the registers 52, 54 is valid command data. The third (or "$h_{write}$") field 52-3, 54-3 of the registers 52, 54 identifies whether the data transfer request is a WRITE operation or a READ operation. The fourth (or "$h_{size}$") field 52-4, 54-4 of the registers 52, 54 contains information identifying the size, in bytes, of the data transfer request. The fifth (or "$h_{burst}$") field 52-5, 54-5 of the registers 52, 54 contains information describing the number of transactions required to perform the requested data transfer operation if the operation is a READ operation. The $h_{burst}$ field 52-5, 54-5 also contains information describing the number of transactions required to perform the requested data transfer operation for certain WRITE operations as well. The sixth (or "endian" field 52-6, 54-6) of the registers 52, 54 provides address information within the data transfer request itself. The seventh (or "$h_{addr}$") field 52-7, 54-7 of the registers 52, 54 contains a starting address, within a memory bank, for the data transfer request. Finally, the eighth (or "bank") field 52-8, 54-8 of the registers 52, 54 identifies a target memory bank for the data transfer request.

Referring next to FIG. 4, the input command decoder circuit 44 of FIG. 2A will now be described in greater detail. As may now be seen, the input command decoder circuit is coupled between the command FIFO 43 and the state machine controller 45. Of course, the input command decoder circuit 44 is equally suitable for use with the memory controller 18' of FIG. 2B by coupling an output side thereof to each one of the state machines 46-1 through 46-4 of the state machine array 46 as well. As may now be seen, the input command decoder circuit 44 includes two parallelized decoder sub-circuits, specifically, a first decoder sub-circuit 56 and a second decoder sub-circuit 58, a command register 60, a flag register 62, a first multiplexer 64 and a second multiplexer 66. The operation of the first input command decoder sub-circuit 56 is substantially the same as the input command decoder circuit disclosed in U.S. patent application Ser. No. 10/036,695. The operation of the second input command decoder sub-circuit 58, however, differs somewhat from operation of the first input command decoder sub-circuit 56. For purposes of this application, however, the first input command decoder sub-circuit 56 is configured to decode "normal burst" data transfer requests received from the command FIFO 43 while the second input command decoder sub-circuit 58 is configured to decode "broken burst" data transfer requests received from the command FIFO 43.

It should be noted that the term "decoder sub-circuit" is not intended to refer to a device or other circuit that performs only a portion of a traditional decoding operation as commonly understood in the art. Rather, each of the first and second input command decoder sub-circuits 56 and 58 is configured to perform a separate and discrete decoding operation on the data transfer request received thereby while the circuitry coupled to the outputs thereof control whether input commands generated by the first input command decoder sub-circuit 56 or input commands generated by the second input command decoder sub-circuit 58 will be propagated to the state machine controller 45. It should also be clearly understood that by "breaking" a received data transfer request into first and second broken burst data transfer requests, it is not intended to refer to a physical division of the command received from the command FIFO 43. Rather, the term refers to an operation in which, by combining information derived from the received command with certain additional information, the second input command decoder sub-circuit 58 can generate a pair of input commands, both of which differ from the input command generated by the first input command decoder circuit 56.

The term "burst" is commonly used in the art to refer to data transfer requests received by the memory controller. For example, the term "read burst" refers to the request and subsequent initiation of a READ operation while the term "write burst" refers to the request and subsequent initiation of a WRITE operation. The term "normal burst" refers to either a read burst or a write burst which will stay within the addressed page of the memory chip which is the target of the operation. The term "broken burst", on the other hand, refers to data transfer requests in which the requested READ or WRITE operation will cross the boundary for the addressed page, i.e., burst out of the addressed page, of the memory chip which is the target of the operation. A broken burst may occur if the size of the data transfer request exceeds the page width of the target memory chip. A broken burst may also occur for data transfer requests that do not exceed the page width of the target memory chip if the size of the data transfer request is greater than the distance separating the starting address for the data transfer request and the boundary of the page.

While the first input command decoder sub-circuit 56 operates generally identically to the input command decoder circuit disclosed in U.S. patent application Ser. No. 10/036, 695, the second input command decoder sub-circuit 58 however, performs a number of additional functions. More specifically, the second input command decoder sub-circuit 58 performs a broken burst check operation on all data transfer requests received thereby. If the results of the broken burst check operation indicates that the data transfer request is a broken burst request, the second input command decoder sub-circuit 56 will: (1) generate a first flag, hereafter referred to as a broken burst flag for propagation to the second multiplexer 66; (2) generate a second flag, hereafter referred to as a registered broken burst flag, for propagation to the broken burst flag register 62; (3) generate a first data transfer request, hereafter referred to as a first broken burst data transfer request, from selected information contained in the data transfer request received from the command FIFO 43; (4) decode the first broken burst data transfer request to generate a first input command for propagation to the multiplexer 66; (5) generate a second data transfer request, hereafter referred to as a second broken burst data transfer request, from selected information contained in the data transfer request received from the command FIFO 43; and (6) decode the second broken burst data transfer request to generate a second input command for propagation to the multiplexer 64. Of course, it should be noted that the steps of generating a broken burst data transfer request from a data transfer request originating at the command FIFO 43 and generating a second input command are typically executed as a single step. To do so, the second input command decoder sub-circuit 58 need only modify selected fields of the first data transfer request received thereby as those fields are being used to construct the second input command.

A command read from the second entry 54 of the command FIFO 43 is transmitted to both of the first input command decoder sub-circuit 56 and the second input command decoder sub-circuit 58. Presuming that the data transfer request is a normal request, the first input command decoder sub-circuit 56 begins to decode the received data transfer request in a conventional manner to generate a first input command for transmission to the state machine controller 45. Generally simultaneously therewith, the second input command decoder sub-circuit 58 checks the received data transfer request to determine if it is a normal data transfer request or a broken burst data transfer request. If the second input command decoder sub-circuit 58 determines that the received data transfer request is a normal burst, the second input command decoder sub-circuit 58 takes no further action. If, however, the second input command decoder sub-circuit 58 determines that the received data transfer request is a broken burst data transfer request, the second input command decoder sub-circuit 58 performs actions (1) through (6), as set forth above.

The first and second multiplexers 64 and 66 are 2:1 multiplexers which pass the "1" input when a control input is asserted and pass the "0" input when the control input is deasserted. The control input is normally deasserted. Accordingly, in the absence of action initiated by the second decoder sub-circuit 58, both the first multiplexer 64 and the second multiplexer 66 will pass the "0" input. Thus, when a data transfer request from the command FIFO 43 is transmitted to both of the first and second input command decoder sub-circuits 56 and 58, and the second input command decoder sub-circuit 58 determines that the received data transfer request is a normal burst, the control inputs to the first and second multiplexers 64 and 66 will remain deasserted. As a result, when the first input command decoder sub-circuit 56 generates a first input command from the received data transfer request, the generated input command will pass through the first multiplexer 64, the second multiplexer 66 and on to the state machine controller 45.

When the second input command decoder sub-circuit 58 determines that the data request read from the command FIFO 43 is a broken burst data request, the second input command decoder sub-circuit 58 generates a pair of flag signals, one tied to the control input of the second multiplexer 66 and the other tied to the flag register 62. The second input command decoder sub-circuit 58 also generates second and third input commands, the first input command being propagated to the second multiplexer 66 and the second input command being propagated to the register 60. As the flag generated by the second input command decoder sub-circuit 58 asserts the control input to the second multiplexer 66, the second multiplexer 66 will pass the "1" input which, as previously set forth, is the second input command generated by the second decoder sub-circuit 58. Having passed the second and third commands to the second multiplexer 66 and the control register 60, respectively, the second input command decoder sub-circuit 58 then re-sets the first and second flags.

On the next rising of the system clock, the register 60 will be enabled, thereby passing the third input command to the first multiplexer 64. The flag register 62 is also enabled, thereby asserting the control input to the first multiplexer 64. As a result, the first multiplexer 64 will pass the third input command to the second multiplexer 66. By resetting the flags, the second input command decoder sub-circuit 58 has deasserted the control input to the second multiplexer 66. As a result, the second multiplexer 66 will now pass the "0" input which, as previously set forth, is the second set of state machine instructions generated by the second input command decoder sub-circuit 58.

Turning next to FIG. 5, the method by which the memory controller 18 handles a data transfer request which, absent the unique processing technique set forth herein, would burst out of a page of the main memory 20 will now be described in greater detail. To identify if a received data transfer request would burst out of a page of the main memory 20, however, it was previously acknowledged the second input command decoder sub-circuit 58 must having certain information regarding the type of SDRAM or other memory chip which forms the main memory 20. Unlike requesting devices, for example, the microprocessor 12, which are typically unaware of the configuration of devices that they are later asked to access, memory controllers, for example, the memory controller 18, typically maintain considerable information regarding the memory to which they control access thereto. Accordingly, the memory controller 18 includes a configuration register (not shown) in which information describing the main memory 20 is maintained. If desired, the second input command decoder sub-circuit 58 may periodically access this configuration register to determine the width of the SDRAM chips forming the main memory 20. Preferably, however, the aforementioned page width information, which, in the disclosed embodiment of the invention, is 512 bytes, is maintained within the second input command decoder sub-circuit 58 as a page width value.

The method commences at step 60. At step 62, a new command containing a data transfer request is fetched from the second entry 54 of the command FIFO 43 and, at step 64, the new command is transmitted to both the first input command decoder sub-circuit 56 and the second input command decoder sub-circuit 58. Assuming that the received command is a normal burst, the first input command decoder sub-circuit 56 begins processing the received command to generate a first input command therefrom. The second input command decoder sub-circuit 58, on the other hand, initiates a check of the received command at step 66 to determine if it is a normal burst or a broken burst.

To determine whether the received command is a normal burst or a broken burst, the second input command decoder sub-circuit 58 checks to see if the data transfer request would burst out of a page of the main memory 20. The second input command decoder sub-circuit 58 compares the page width value previously stored therein to the sum of: (1) the value contained in the $h_{addr}$ field 54-7; and (2) a total burst count for the received data transfer request. The total burst count is equal to the product of the values contained in the $h_{size}$ field 54-4 and the $h_{burst}$ field 54-5 of the received data transfer request. If the sum of $h_{addr}$ and the total burst count is less than or equal to the page width value, then the second input command decoder sub-circuit 58 determines that the received data transfer request is a normal burst. The method will then proceed to step 68 for initiation of processing of the received data transfer request in a first processing mode hereafter referred to as normal burst processing mode.

Continuing on to step 70, the first input command decoder sub-circuit 56 continues generation of the received data transfer request while the second decoder sub-circuit 58 takes no further action. As the first and second flags controlled by the second decoder sub-circuit 58 remain in their initial unset condition, the control inputs to the first and second multiplexers 64 and 66 are deasserted. As a result, the first input command generated by the first input command decoder sub-circuit 56 is passed, in sequence, by the first multiplexer 64 and the second multiplexer 66 and on to the state machine controller 45 for further processing in the manner previously described with respect to FIG. 2A. Having generated an input command suitable for use by the state machine controller 45, the method ends at step 72

Returning now to step 66, if the sum of $h_{addr}$ and the total burst count is greater than the page width value, then the second input command decoder sub-circuit 58 determines that the received data transfer request is a broken burst. The method will then proceed to step 74 for initiation of processing of the received data transfer request in a second processing mode hereafter referred to as broken burst processing mode. The method then proceeds to step 76 where the second input command decoder sub-circuit 58 sets a first flag coupled to the control input of the second multiplexer 66 and sets a second flag coupled to the flag register 62.

While a first part of the logic circuitry forming the second input command decoder sub-circuit 58 is checking to determine if the received data transfer request is a broken burst, a second part of the logic circuitry is computing a burst sub-count for the potential first part of the broken burst and the potential second part of the broken burst. The burst count is a control parameter determining the number memory clock cycles needed for a complete read/write burst. The burst count for the first part of the broken burst is calculated based on $h_{addr}$, $h_{size}$ and $h_{burst}$, i.e. the number of bytes needs to be transferred in the first part of the broken burst. The burst count for the second part of the broken burst is calculated based on the number of bytes needs to be transferred in the second part of broken burst. The $h_{size}$ is the same for the first and second parts of the broken burst. The $h_{addr}$ is always zero for the second part of the broken burst. The calculated burst count for the second part of the broken burst will be registered for later use. The $h_{burst}$ is only used for calculating burst count. So, $h_{burst}$ is not registered after use.

Proceeding on to step 78, the second input command decoder sub-circuit 58 generates a second input command which relates to that portion of the data transfer request that would not burst out of the page in the main memory 20. To construct the second input command, the second input command decoder sub-circuit 58 must determine a burst sub-count for the second input command which takes into account the data transfer request having been divided into two requests. The burst sub-count may be determined by subtracting the starting address $h_{addr}$ from the page width parameter.

Using the original values for various fields of the received data transfer request and the newly determined burst sub-count, the second input command decoder sub-circuit 58 generates a second input command for transmission to the second multiplexer 66. As the second input command decoder sub-circuit 58 sets the control input for the second multiplexer 66 generally simultaneously therewith with the generation of the second input command, the second input command generated by the second input command decoder sub-circuit 58 is passed by the second multiplexer 66 and on to the state machine controller 45 for further processing.

Proceeding on to step 80, the second input command decoder sub-circuit 58 generates a third input command for transmission to the command register 60. Like the second input command produced thereby, the third input command is generated from the information contained in the data transfer request from the command FIFO 43. Now, however, the third input command to be generated by the second input command decoder sub-circuit 58 relates to that portion of the data transfer request that would burst out of the page in the main memory 20. As before, the second input command decoder sub-circuit 58 must determine a burst sub-count for the third input command which takes into account the data transfer request having been divided into two requests. For the third input command, the value of the burst sub-count is determined by subtracting the burst sub-count for the second input command from the total burst count for the original data transfer request. From the newly determined burst sub-count and the original values for various fields of the received data transfer request, the second input command decoder sub-circuit 58 generates a third input command for transmission to the control register 60.

Proceeding to step 82, the command register 60 and the flag register 62 are triggered on the next rising edge of the system clock, thereby causing the respective contents thereof to be passed to the "1" and control inputs, respectively of the first multiplexer 64. As the output from the flag register 62 causes the control input to the first multiplexer 64 to be asserted, the first multiplexer 64 passes the third input command generated by the second input command decoder sub-circuit 58 to the second multiplexer 66. As previously mentioned, the control input to the second multiplexer 66 has since been deasserted. As a result, the third input command generated by the second input command decoder sub-circuit 58 are passed to the state machine controller 45, thereby completing the disclosed technique of detecting data transfer requests that would otherwise burst out of a page of the main memory 20, generating plural data transfer requests to replace the original request and transmitting the replacement requests to the main memory where they may be properly handled thereby.

Those skilled in the art will appreciate that the present invention may be accomplished with circuits other than those particularly depicted and described in connection with the drawings and it should be clearly understood that the drawings represent just one of many possible implementations of the present invention. It should be further appreciated that, although specific embodiments of the invention have been described herein, various modifications may be made without deviating from the spirit and scope of the invention. Those skilled in the art should also appreciate that various terms used herein are sometimes used with somewhat different meanings. For example, the term "bank" may refer solely to a memory bank or may refer to both the memory bank and its associated access circuitry. A "command" may refer solely to a command type (e.g., read or write), or may refer also to the associated address to which the command is directed. The term "couple" or "coupled" may refer solely to a direct connection between two elements, may refer solely to an indirect connection between two elements, or may refer to both. Therefore, terms used in the claims which follow shall be construed to include any of the various meanings know to those skilled in the art. Accordingly, the scope of the invention should not be limited by the above disclosure. Rather, the scope of the invention should be defined by the appended claims.

What is claimed is:

1. A computer system, comprising:
   a processor;
   a memory; and
   a memory controller having a first side coupled to said processor and a second side coupled to said memory, said memory controller comprising:
   a first decoder circuit coupled between said first and second sides of said memory controller, said first decoder circuit generating a first input command for executing a data transfer request to/from said memory if said data transfer request relates to a data transfer sized at or below a threshold value; and a second decoder circuit coupled between said first and second sides of said memory controller, said second decoder circuit generating second and third input commands for executing said data transfer request to/from said memory if said data transfer request relates to a data transfer sized above said threshold value.

2. The computer system of claim 1, wherein said data transfer request will burst over a page of said memory if said data transfer request is sized above said threshold value.

3. The computer system of claim 2, wherein said threshold value may be determined from a page size for said memory, a size of said data transfer request and a starting address, within said memory, for said data transfer request.

4. The computer system of claim 3, wherein said memory controller further comprises:

a multiplexer having a first input coupled to said first decoder circuit, a second input coupled to said second decoder circuit and an output coupled to said output side of said memory controller;

said multiplexer configured to selectively pass said first input command generated by said first decoder circuit if said data transfer request relates to a data transfer sized at or below said first threshold value or said second and third input commands generated by said second decoder circuit if said data transfer request relates to a data transfer sized above said first threshold value.

5. The computer system of claim 4, wherein:

said multiplexer is controlled by a flag generated by said second decoder circuit;

said multiplexer selectively passing said first input command generated by said first decoder circuit if said flag is unset or said third input command generated by said second decoder circuit if said flag is set;

said multiplexer subsequently passing said third input command generated by said second decoder circuit if said flag is reset after passing said second input command.

6. The computer system of claim 3, wherein said memory controller further comprises:

a first multiplexer having a first input coupled to said first decoder circuit, a second input coupled to said second decoder circuit and an output; and a second multiplexer having a first input coupled to said output of said first multiplexer, a second input coupled to said second decoder circuit and an output coupled to said output side of said memory controller;

said first multiplexer configured to selectively pass said first input command generated by said first decoder circuit if said data transfer request relates to a data transfer sized at or below said threshold value;

said second multiplexer configured to selectively pass said first input command passed by said first multiplexer if said data transfer request relates to a data transfer sized at or below said threshold value;

said first multiplexer further configured to pass, in sequence, said first input command generated by said first decoder circuit and said third input command generated by said second decoder circuit if said data transfer request relates to a data transfer sized above said threshold value;

said second multiplexer further configured to pass, in sequence, said second input command generated by said second decoder circuit and said third input command generated by said second decoder circuit and passed by said first multiplexer if said data transfer request relates to a data transfer sized above said threshold value.

7. The computer system of claim 6, wherein:

said first multiplexer is controlled by a first flag generated by said second decoder circuit;

said second multiplexer is controlled by a second flag generated by said second decoder circuit;

said first multiplexer passing said first input command generated by said first decoder circuit if said first flag is unset said second multiplexer passing said first input command passed by said first multiplexer if said second flag is unset;

said second multiplexer passing said second input command generated by said second decoder circuit if said second is set;

said first multiplexer subsequently passing said third input command generated by said second decoder circuit if said first flag is subsequently set; and said second multiplexer subsequently passing said third input command passed by said first multiplexer if said second flag is subsequently reset.

8. The computer system of claim 7, and further comprising:

a clocked register coupled between said second decoder circuit and said first multiplexer, said register maintaining said third input command generated by said second decoder circuit;

a clocked latch coupled between said second decoder circuit and said first multiplexer, said latch maintaining said first flag generated by said second decoder circuit;

said third input command and said first flag being clocked into said first multiplexer after said second input command generated by said second decoder circuit has been passed by said second multiplexer.

9. A memory subsystem for an electronic device, said memory subsystem comprising:

at least one memory chip; and a memory controller for controlling accesses to said at least one memory chip, said memory controller comprising:

a first decoder circuit having input and output sides;

a second decoder circuit having input and output sides, said input side of said second decoder circuit coupled to said input side of said first decoder circuit;

a multiplexer circuit having input and output sides, said input side of said multiplexer circuit coupled to said output sides of said first and second decoder circuits and said output side of said multiplexer circuit coupled to said at least one memory chip;

said multiplexer circuit configured to selectively pass a first input command, generated by said first decoder circuit, for executing a data transfer request if said memory controller is to control a data transfer sized at or below a threshold value or second and third input commands, generated by said second decoder circuit, for executing said data transfer request if said memory controller is to control a data transfer sized above said threshold value.

10. The memory subsystem of claim 9, wherein said data transfer request will burst over a page of said memory chip if said data transfer request is sized above said first threshold value.

11. The memory subsystem of claim 9, wherein said threshold value may be determined from a page size for said memory chip, a size of said data transfer request and a starting address, within said memory chip, for said data transfer request.

12. The memory subsystem of claim 9, wherein said multiplexer circuit further comprises:
   a first multiplexer having a first input coupled to said first decoder circuit, a second input coupled to said second decoder circuit and an output; and
   a second multiplexer having a first input coupled to said output of said first multiplexer, a second input coupled to said second decoder circuit and an output coupled to said output side of said memory controller;
   said first multiplexer configured to selectively pass said first input command generated by said first decoder circuit if said data transfer request relates to a data transfer sized at or below said threshold value;
   said second multiplexer configured to selectively pass said first input command passed by said first multiplexer if said data transfer request relates to a data transfer sized at or below said threshold value;
   said first multiplexer further configured to pass, in sequence, said first input command generated by said first decoder circuit and said third input command generated by said second decoder circuit if said data transfer request relates to a data transfer sized above said threshold value;
   said second multiplexer further configured to pass, in sequence, said second input command generated by said second decoder circuit and said third input command generated by said second decoder circuit and passed by said first multiplexer if said data transfer request relates to a data transfer sized above said threshold value.

13. The memory subsystem of claim 12, wherein said data transfer request will burst over a page of said memory chip if said data transfer request is sized above said threshold value.

14. The memory subsystem of claim 12, wherein said threshold value may be determined from a page size for said memory chip, a size of said data transfer request and a starting address, within said memory chip, for said data transfer request.

15. A memory controller, comprising:
   a first decoder circuit having input and output sides;
   a second decoder circuit having input and output sides, said input side of said second decoder circuit coupled to said input side of said first decoder circuit;
   a multiplexer circuit having input and output sides, said input side of said multiplexer circuit coupled to said output sides of said first and second decoder circuits;
   said multiplexer circuit configured to selectively pass a first input command generated by said first decoder circuit if said memory controller is to control a data transfer sized at or below a threshold value or second and third input commands generated by said second decoder circuit if said memory controller is to control a data transfer sized above said threshold value.

16. The memory controller of claim 15, wherein said multiplexer circuit further comprises:
   a first multiplexer having a first input coupled to said first decoder circuit, a second input coupled to said second decoder circuit and an output; and
   a second multiplexer having a first input coupled to said output of said first multiplexer, a second input coupled to said second decoder circuit and an output coupled to said output side of said memory controller;
   said first multiplexer configured to pass said first input command generated by said first decoder circuit if said memory controller is to control a data transfer sized at or below said threshold value;
   said second multiplexer configured to selectively pass said first input command passed by said first multiplexer if said memory controller is to control a data transfer sized at or below said threshold value;
   said first multiplexer further configured to pass, in sequence said first input command generated by said first decoder circuit and said third input command generated by said second decoder circuit if said memory controller is to control a data transfer sized above said threshold value; and
   said second multiplexer further configured to pass, in sequence, said second input command generated by said second decoder circuit and said third input command generated by said second decoder circuit and passed by said first multiplexer if said memory controller is to control a data transfer sized above said threshold value.

* * * * *